US012706608B2

(12) United States Patent
Luo et al.

(10) Patent No.: US 12,706,608 B2
(45) Date of Patent: Aug. 11, 2026

(54) DIFFERENTIAL LATCH CIRCUIT, SWITCH DRIVER, AND DIGITAL-TO-ANALOG CONVERSION CIRCUIT

(71) Applicant: SANECHIPS TECHNOLOGY CO., LTD., Shenzhen (CN)

(72) Inventors: Hao Luo, Shenzhen (CN); Wentao Zhu, Shenzhen (CN); Yumei Diao, Shenzhen (CN); Haipeng Zhu, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 64 days.

(21) Appl. No.: 18/996,049

(22) PCT Filed: Aug. 17, 2023

(86) PCT No.: PCT/CN2023/113430

§ 371 (c)(1),
(2) Date: Jan. 17, 2025

(87) PCT Pub. No.: WO2024/041437

PCT Pub. Date: Feb. 29, 2024

(65) Prior Publication Data

US 2026/0019082 A1 Jan. 15, 2026

(30) Foreign Application Priority Data

Aug. 26, 2022 (CN) ........................ 202211043550.2

(51) Int. Cl.
*H03K 19/0185* (2006.01)
*H03K 3/356* (2006.01)

(Continued)

(52) U.S. Cl.
CPC ............... *H03K 19/018521* (2013.01); *H03K 3/356104* (2013.01); *H03K 19/00315* (2013.01);

(Continued)

(58) Field of Classification Search
CPC ..... H03K 19/018521; H03K 3/356104; H03K 19/00315; H03K 19/01855; H03K 3/356;

(Continued)

(56) References Cited

U.S. PATENT DOCUMENTS

2005/0225465 A1* 10/2005 Zhang ................. H03M 1/0624 341/144
2013/0049808 A1* 2/2013 Panov ............ H03K 19/018507 326/80

* cited by examiner

*Primary Examiner* — Daniel D Chang
(74) *Attorney, Agent, or Firm* — Li & Cai Intellectual Property (USA) Office

(57) ABSTRACT

Provided are a differential latch circuit, a switch driver, and a digital-to-analog conversion circuit. The differential latch circuit includes: a first-stage differential latch circuit (I), a second-stage differential inverter circuit (II), and a low-level shift circuit, a pull-up terminal of a differential positive terminal of the second-stage differential inverter circuit (II) includes a first P-Channel Metal-Oxide-Semiconductor (PMOS) transistor (M9) and a second PMOS transistor (M10), a pull-down terminal of the differential positive terminal of the second-stage differential inverter circuit (II) includes a third PMOS transistor (M15) and a first N-Channel Metal-Oxide-Semiconductor (NMOS) transistor (M11), and a circuit structure of a differential negative terminal of the first-stage differential latch circuit (I) is symmetrical to a circuit structure of a differential positive terminal of the first-stage differential latch circuit (I).

20 Claims, 7 Drawing Sheets

(51) Int. Cl.
*H03K 19/003* (2006.01)
*H03M 1/06* (2006.01)
*H03M 1/66* (2006.01)

(52) U.S. Cl.
CPC .... *H03K 19/01855* (2013.01); *H03M 1/0612* (2013.01); *H03M 1/662* (2013.01)

(58) Field of Classification Search
CPC ........................ H03K 17/6872; H03M 1/0612; H03M 1/662; H03M 1/66
See application file for complete search history.

Low-level shift circuit

Fclk
Fclk
Fclk
D_in
Latch
Latch
Inventive Latch
D
Db_in
Latch
Latch
Inventive Latch
Db
Dum_in
Latch
Latch
Inventive Latch
Dum
Dumb_in
Latch
Latch
Inventive Latch
Dumb
A B C D
$\bar{A}$ $\bar{B}$ $\bar{C}$ $\bar{D}$
A B C D
$\bar{A}$ $\bar{B}$ $\bar{C}$ $\bar{D}$
Fclk=Fdata

DIFFERENTIAL LATCH CIRCUIT, SWITCH DRIVER, AND DIGITAL-TO-ANALOG CONVERSION CIRCUIT

CROSS-REFERENCE TO RELATED APPLICATIONS

The present disclosure claims the priority to Chinese Patent Application No. 202211043550.2 entitled "Differential Latch Circuit, Switch Driver, and Digital-To-Analog Conversion Circuit" and filed with the CNIPA on Aug. 26, 2022, the contents of which are incorporated herein by reference in their entirety.

TECHNICAL FIELD

Embodiments of the present disclosure relate to, but are not limited to, the field of integrated circuit design, and particularly relate to a differential latch circuit, a switch driver, and a digital-to-analog conversion circuit.

BACKGROUND

FIG. 1 is a system block diagram of a Digital to Analog Converter (DAC) in the related technology. As shown in FIG. 1, the DAC includes a data path (Data Path), a clock path (CLK Path), and a DAC core circuit (DAC Core). The data path includes an interface circuit (Interface), a digital data path (Digital Data Path), a decoder (Decoder), a serializer (Serializer), and a switch driver (Switch Driver). The clock path includes a clock receiver (Clock Receiver), a delay locked loop (DLL), a divider (Divider), and some clock drivers. The DAC core circuit includes a plurality of DAC core units (DAC Core Slices). For the DAC, the design of the switch driver in the data path is important, and may affect a plurality of indexes such as linearity, power consumption, and noise.

In the data path, an input digital signal is first subjected to data reception and processing by the interface circuit and the digital data path; a main function of the decoder is to perform DAC segmented encoding, and specifically, DAC high bits are generally encoded by thermometer code, and DAC low bits are generally encoded by binary code; and in addition, some algorithms, such as Dynamic Element Matching (DEM), dither, and rotation, may be applied to data in the decoder. Since the digital data path and the decoder are digital P&R modules and cannot realize high data rates, each bit of data of the DAC is generally divided for multiple phase transmission in these digital modules. A main function of the serializer is to convert multi-phase data into single-phase data or data with less phases. A main function of the switch driver is to synchronize each bit of data, improve driving capability, and reduce inter-symbol interference. According to a specific architecture and requirements of the DAC core units, the switch driver may further need to perform adjustment of data intersection points (i.e., intersections of rising edges and falling edges of differential output data) and adjustment of data level, and these adjustments may greatly affect the performance such as linearity and noise of the DAC adopting the switch driver.

FIG. 2 is a conventional switch driver structure in the related technology. The conventional switch driver structure adopts rising edges of a clock for data sampling; and in order to realize data synchronization well, three stages of latches (Latch) are used for step-by-step synchronization, the upper two paths perform transmission of real signals, and the lower two paths are added for transmission of Dummy data, so as to reduce an influence of a signal-related current on the performance of the DAC [1]. At each data sampling point, if the real data is not flipped, the Dummy data is flipped; and if the real data is flipped, the Dummy data is not flipped.

There are many variations of the conventional switch driver. For example:

1. The number of stages of the latches may be different.
2. The latch may be replaced with a D-type Flip-Flop (DFF), or a multiplexer (MUX) having both a data combination function and a synchronization function, or some other sequential logic. Some combinational logic may be also included in the design.
3. The MUX may be implemented in various ways. The MUX may be a combinational logic MUX, including an OR/NOR MUX, or an AND/NAND MUX. Alternatively, the MUX may be in the form of a combinational logic MUX together with a clock-triggered Latch or a clock-triggered DFF. Alternatively, the MUX may be some other types of clock-triggered MUXs that perform data combination and synchronization simultaneously.
4. The input data may be the general data as shown in FIG. 2, Return-to-Zero data, or Return-to-One data. For different types of data, the corresponding sequential logic circuits such as the latch, the DFF, and the MUX may be different, and the combinational logic may also be different.
5. The paths for the Dummy data may be implemented in different ways or even be deleted.
6. In addition, multi-mode compatibility may be realized on the switch driver. FIG. 3 shows a conventional multi-mode compatible switch driver structure, which is characterized by the compatibility between a normal mode and a mixing mode. In the mixing mode, data changes occur on both rising edges and falling edges of the clock, and the data corresponding to the falling edges is an inversion of the data corresponding to the rising edges, which is equivalent to a mixing effect of a real signal and a clock signal, and a bandpass transfer function taking Folk as a center is finally realized in the output of the DAC. A low-pass transfer function is realized in the normal mode, which is favorable for high-intermediate-frequency and low-bandwidth applications.

Although there are many variations of the switch driver, the sequential logic circuits such as the latch, the DFF, and the MUX which have the synchronization function and some combinational logic circuits belong to basic units of the variations of the switch driver. FIG. 4 is a schematic diagram of a conventional differential latch structure in the related technology. The conventional differential latch structure adopts a Complementary Metal-Oxide Semiconductor (CMOS) architecture, and outputs rail-to-rail high levels and low levels, a front stage of the conventional differential latch structure is a latch triggered by a clock level, and a rear stage of the conventional differential latch structure is an inverter for improving driving capability of the latch.

As shown in FIG. 4, a left side and a right side of the conventional differential latch structure are symmetrical. Taking the left side as an example, when clkp is a low level and clkn is a high level, din is collected by the Latch in the first stage and is transmitted to output dout through the inverter in the second stage; and when clkp is a high level and clkn is a low level, a path of din is disconnected, and dout remains unchanged.

There are also many variations of the conventional Latch, for example:

1. The inverter in the rear stage may be replaced with a buffer.
2. A P-Channel Metal-Oxide-Semiconductor (PMOS) source terminal of the inverter in the rear stage may be not connected to a power supply but connected to the output of a level shift circuit, so that a high level output by the inverter is not taken as a power supply but is a specially designed voltage. Similarly, an N-Channel Metal-Oxide-Semiconductor (NMOS) source terminal of the inverter may be not grounded but connected to the output of the level shift circuit, so that a low level output by the inverter is not taken as a ground but is a specially designed voltage. In addition, a power ground of the latch in the first stage may be also connected to the output of the level shift circuit.
3. A PMOS width-to-length ratio and an NMOS width-to-length ratio of the inverter in the rear stage may be intentionally designed to be asymmetrical, so as to adjust intersection points of output data of the inverter. Similarly, a PMOS width-to-length ratio and an NMOS width-to-length ratio of the latch in the front stage may be also intentionally designed to be asymmetrical.
4. The above variations also apply to the design of the DFF and the MUX which have the synchronization function, to in the design of the other sequential logic circuits, and the design of the combinational logic circuits.

The conventional latch has the following disadvantages:

1. There is a limitation in the adjustment of the intersection points of the output data of the inverter simply through the setting of the PMOS width-to-length ratio and the NMOS width-to-length ratio. If a difference between the PMOS width-to-length ratio and the NMOS width-to-length ratio is too large, a large-size MOS transistor may cause a heavy load in the front stage, and the large size may cause a large current. A source-drain connection of the MOS transistor may cause a large IR drop when implemented in a layout, such that current capability of the MOS transistor may be affected, which affects an adjustment effect of the intersection points of the output data and also affects the linearity of the DAC. A small-size MOS transistor may cause slow edges of the output data and has a large mismatch, such that the edges of the output data of different bits of the DAC deviate greatly and the linearity of the DAC is affected.
2. If a level shift circuit is added to the conventional latch, the adjustment of the intersection points of the output data may be further affected because the level shift circuit may cause a mismatch between a PMOS terminal and an NMOS terminal and the mismatch may affect the intersection points of the output data. If an offset of the intersection points is opposite to requirements, it is difficult to achieve the goal by simply adjusting the PMOS width-to-length ratio and the NMOS width-to-length ratio.

SUMMARY

The embodiments of the present disclosure provide a differential latch circuit, a switch driver, and a digital-to-analog conversion circuit.

According to one embodiment of the present disclosure, there is provided a differential latch circuit, including a first-stage differential latch circuit, a second-stage differential inverter circuit, and a low-level shift circuit connected in sequence, wherein a pull-up terminal of a differential positive terminal of the second-stage differential inverter circuit includes a first PMOS transistor and a second PMOS transistor, and a gate electrode of the first PMOS transistor is connected to a gate electrode of the second PMOS transistor; a source electrode of the first PMOS transistor is connected to a power supply voltage; a drain electrode of the first PMOS transistor is connected to a source electrode of the second PMOS transistor; the gate electrode of the first PMOS transistor and the gate electrode of the second PMOS transistor are connected to a data input terminal of the differential positive terminal of the second-stage differential inverter circuit; a pull-down terminal of the differential positive terminal of the second-stage differential inverter circuit includes a third PMOS transistor and a first NMOS transistor, and a drain electrode of the third PMOS transistor and a source electrode of the first NMOS transistor are connected to each other, and are connected both to an output terminal of a level shift circuit; a gate electrode of the third PMOS transistor is connected to the data input terminal of the differential positive terminal of the second-stage differential inverter circuit, and the source electrode of the third PMOS transistor is connected to an output terminal of a pull-down terminal of a differential negative terminal of the second-stage differential inverter circuit; a drain electrode of the first NMOS transistor is connected to a drain electrode of the second PMOS transistor, and a gate electrode of the first NMOS transistor is connected to the data input terminal of the differential positive terminal of the second-stage differential inverter circuit; and a circuit structure of a differential negative terminal of the first-stage differential latch circuit is symmetrical to a circuit structure of a differential positive terminal of the first-stage differential latch circuit.

According to another embodiment of the present disclosure, there is provided a switch driver, including a plurality of switch driver units, wherein each of the switch driver units includes: multiple data transmission links, and each data transmission link includes the differential latch circuit provided in the above embodiment.

According to still another embodiment of the present disclosure, there is further provided a digital-to-analog conversion circuit, including the switch driver provided in the above embodiment and a digital-to-analog conversion core circuit connected to an output terminal of the switch driver.

BRIEF DESCRIPTION OF DRAWINGS

FIG. 5(*b*) is a schematic diagram illustrating another connection mode of a fourth PMOS transistor in a second-stage differential inverter circuit according to an embodiment of the present disclosure;

FIG. 5(*c*) is a schematic diagram illustrating still another connection mode of the fourth PMOS transistor in the second-stage differential inverter circuit according to an embodiment of the present disclosure;

DETAIL DESCRIPTION OF EMBODIMENTS

The embodiments of the present disclosure will be described in detail below with reference to the drawings and the embodiments.

Figure 1:
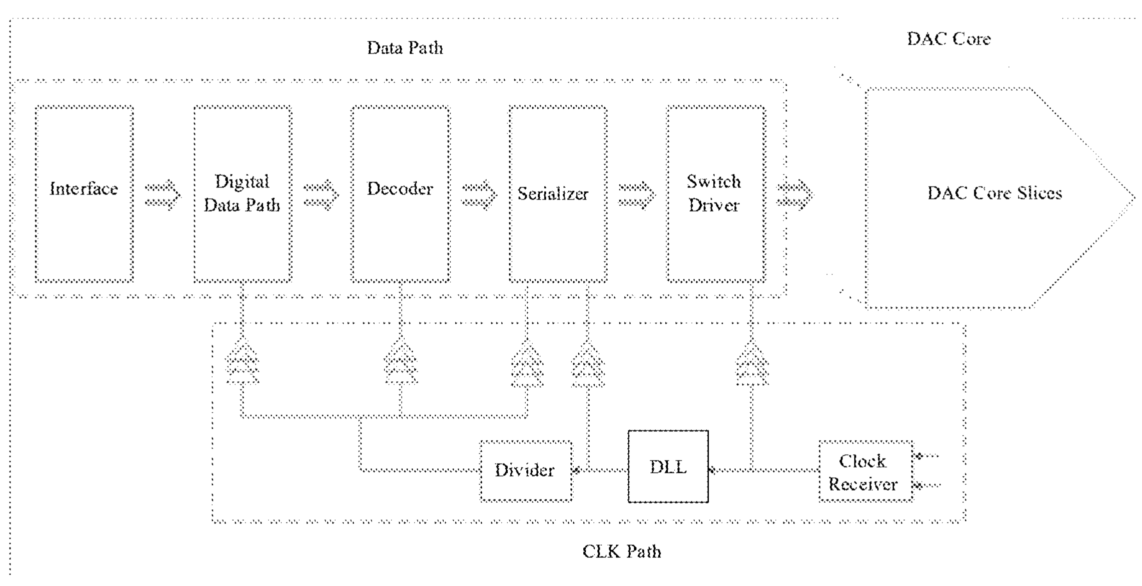
FIG. 1 is a system block diagram of a DAC in the related technology.
Figure 2:
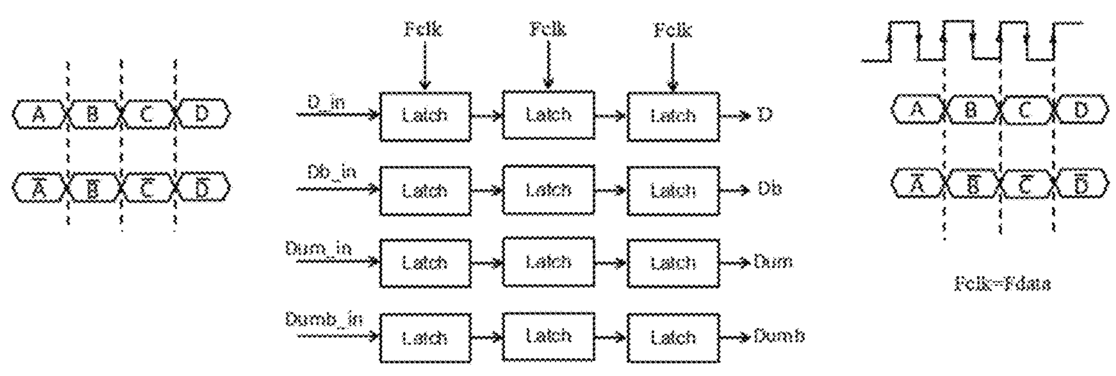
FIG. 2 is a schematic diagram of a conventional switch driver structure in the related technology.
Figure 3:
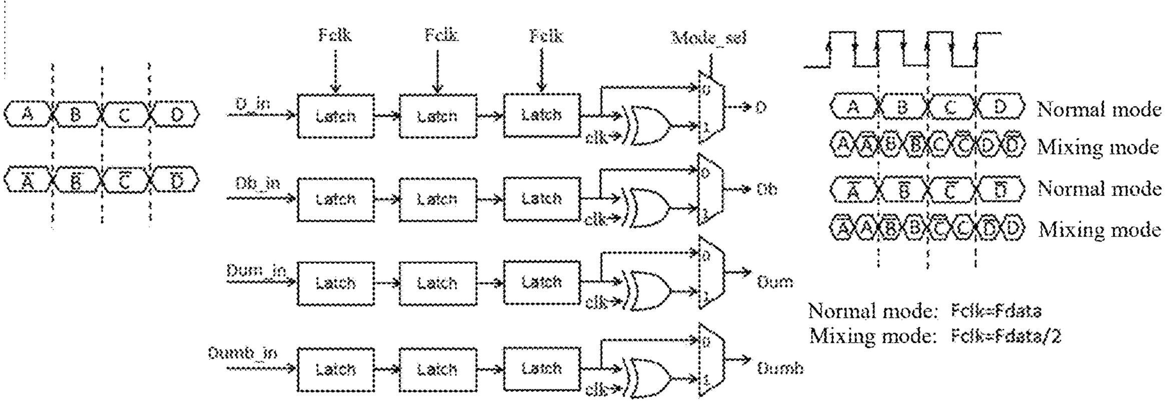
FIG. 3 is a schematic diagram of a conventional multi-mode compatible switch driver structure.
Figures 4, 5A:
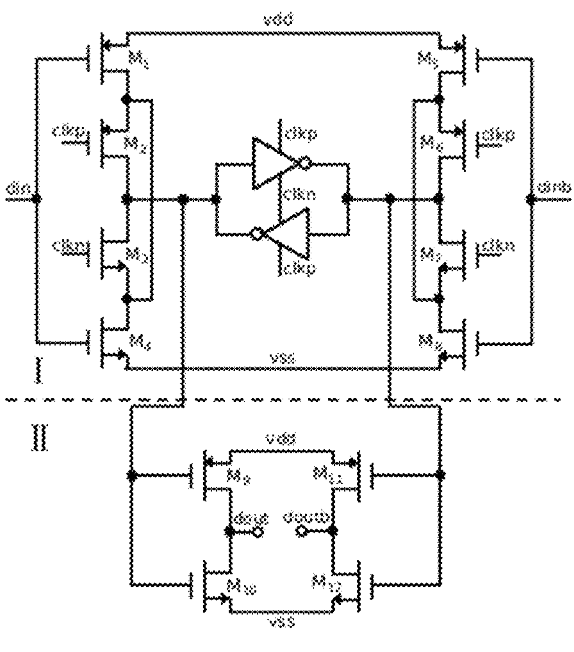
FIG. 4 is a schematic diagram of a conventional differential latch structure in the related technology.
Figure 5B:
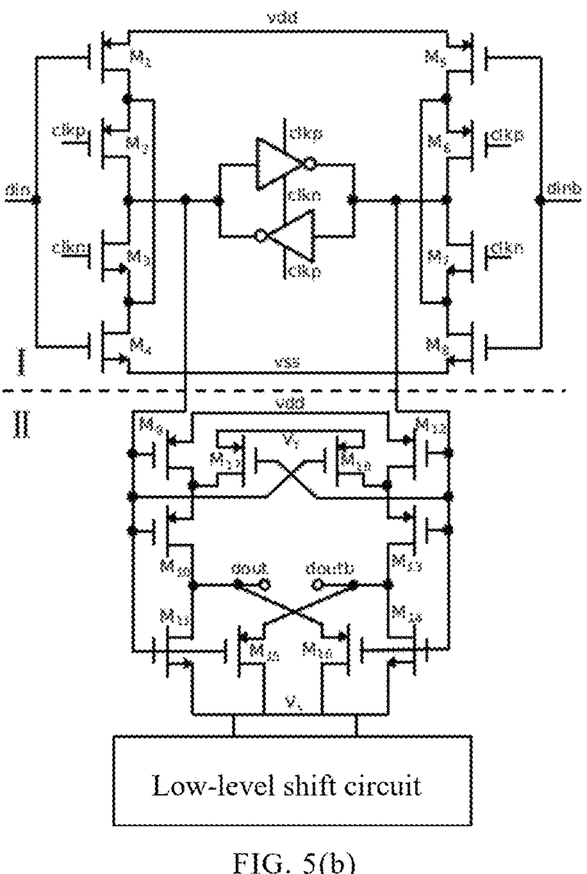
FIG. 5(*a*) is a schematic structural diagram of a differential latch circuit according to an embodiment of the present disclosure.
Figure 5C:
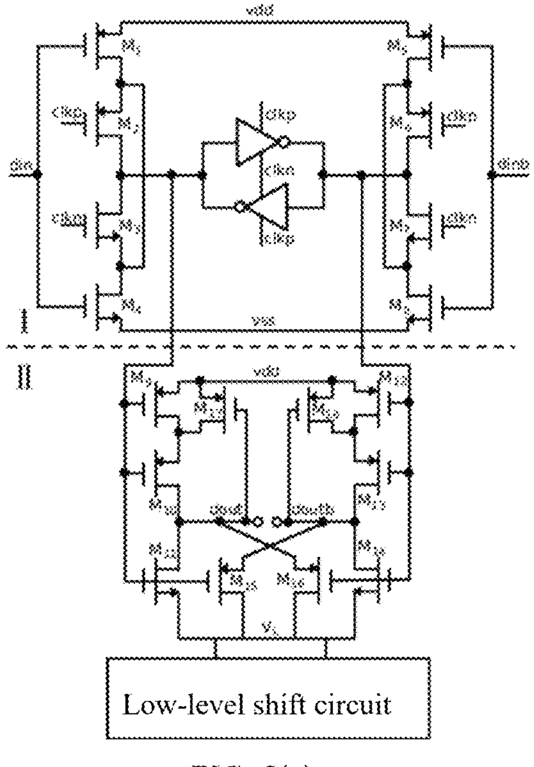

FIG. 5(*a*) is a schematic structural diagram of a differential latch circuit according to an embodiment of the present disclosure. As shown in FIG. 5(*a*), the differential latch circuit includes a first-stage differential latch circuit I, a second-stage differential inverter circuit II, and a low-level shift circuit.

A pull-up terminal of a differential positive terminal of the second-stage differential inverter circuit II includes a first PMOS transistor M9 and a second PMOS transistor M10, and a gate electrode of the first PMOS transistor M9 is connected to a gate electrode of the second PMOS transistor M10; a source electrode of the first PMOS transistor M9 is connected to a power supply voltage; a drain electrode of the first PMOS transistor M9 is connected to a source electrode of the second PMOS transistor M10; the gate electrode of the first PMOS transistor M9 and the gate electrode of the second PMOS transistor M10 are connected to a data input terminal of the differential positive terminal of the second-stage differential inverter circuit; a pull-down terminal of the differential positive terminal of the second-stage differential inverter circuit includes a third PMOS transistor M15 and a first NMOS transistor M11, and a drain electrode of the third PMOS transistor M15 and a source electrode of the first NMOS transistor M11 are connected to each other, and are connected both to an output terminal of a level shift circuit; a gate electrode of the third PMOS transistor M15 is connected to the data input terminal of the differential positive terminal of the second-stage differential inverter circuit, and the source electrode of the third PMOS transistor M15 is connected to an output terminal of a pull-down terminal of a differential negative terminal of the second-stage differential inverter circuit; a drain electrode of the first NMOS transistor M11 is connected to a drain electrode of the second PMOS transistor M10, and a gate electrode of the first NMOS transistor M11 is connected to the data input terminal of the differential positive terminal of the second-stage differential inverter circuit; and a circuit structure of a differential negative terminal of the first-stage differential latch circuit is symmetrical to a circuit structure of a differential positive terminal of the first-stage differential latch circuit.

In the present embodiment, as shown in FIG. 5(*a*), the differential positive terminal of the second-stage differential inverter circuit further includes: a fourth PMOS transistor M17, a source electrode of the fourth PMOS transistor M17 is connected to the power supply voltage, a gate electrode of the fourth PMOS transistor M17 is connected to a data input terminal of the differential negative terminal of the second-stage differential inverter circuit, and a drain electrode of the fourth PMOS transistor M17 is connected to a first series node between the first PMOS transistor M9 and the second PMOS transistor M10, so as to adjust a voltage of the series node.

In an exemplary implementation, the fourth PMOS transistor may be connected in the second-stage differential inverter circuit in other modes. As shown in FIG. 5(*b*), the source electrode of the fourth PMOS transistor M17 is connected to a source electrode of a fifth PMOS transistor M18 located at the differential negative terminal of the second-stage differential inverter circuit and corresponding to the fourth PMOS transistor M17; and the gate electrode of the fourth PMOS transistor M17 is connected to the data input terminal of the differential negative terminal of the second-stage differential inverter circuit, and the drain electrode of the fourth PMOS transistor M17 is connected to the first series node between the first PMOS transistor M9 and the second PMOS transistor M10.

In an exemplary implementation, the fourth PMOS transistor may be connected in the second-stage differential inverter circuit in other modes. As shown in FIG. 5(*c*), the source electrode of the fourth PMOS transistor M17 is connected to the power supply voltage, the gate electrode of the fourth PMOS transistor M17 is connected to a data output terminal of the differential positive terminal of the second-stage differential inverter circuit, and the drain electrode of the fourth PMOS transistor M17 is connected to the first series node between the first PMOS transistor M9 and the second PMOS transistor M10.

In the present embodiment, the first series node is located between the drain electrode of the first PMOS transistor M9 and the source electrode of the second PMOS transistor M10.

Figures 6, 7:
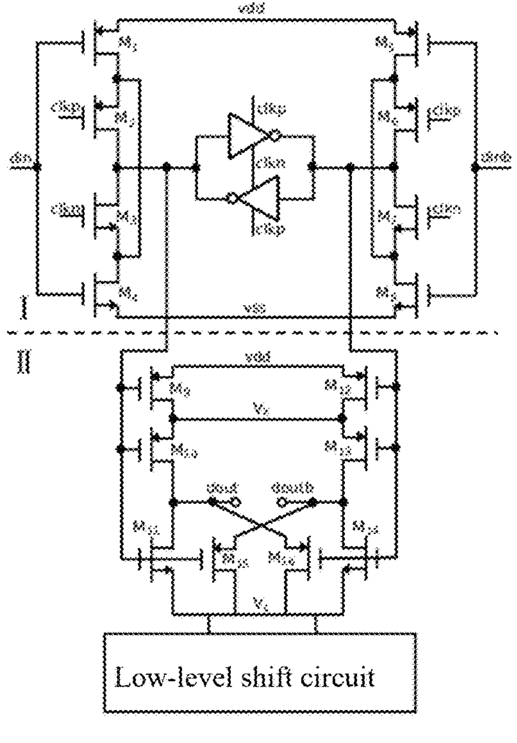
FIG. 6 is a schematic structural diagram of a differential latch circuit according to another embodiment of the present disclosure.
FIG. 7 is a schematic structural diagram of a switch driver according to an embodiment of the present disclosure.

FIG. 6 is a schematic structural diagram of a differential latch circuit according to another embodiment of the present disclosure. As shown in FIG. 6, the pull-up terminal of the differential positive terminal of the second-stage differential inverter circuit II includes the first PMOS transistor M9 and the second PMOS transistor M10, and the gate electrode of the first PMOS transistor M9 is connected to the gate electrode of the second PMOS transistor M10; the source electrode of the first PMOS transistor M9 is connected to the power supply voltage; the drain electrode of the first PMOS transistor M9 is connected to the source electrode of the second PMOS transistor M10; the gate electrode of the first PMOS transistor M9 and the gate electrode of the second PMOS transistor M10 are connected to the data input terminal of the differential positive terminal of the second-stage differential inverter circuit; the pull-down terminal of the differential positive terminal of the second-stage differential inverter circuit includes the third PMOS transistor M15 and the first NMOS transistor M11, and the drain electrode of the third PMOS transistor M15 and the source electrode of the first NMOS transistor M11 are connected to each other, and are connected both to the output terminal of the level shift circuit; the gate electrode of the third PMOS transistor M15 is connected to the data input terminal of the differential positive terminal of the second-stage differential inverter circuit, and the source electrode of the third PMOS transistor M15 is connected to the output terminal of the pull-down terminal of the differential negative terminal of the second-stage differential inverter circuit; the drain electrode of the first NMOS transistor M11 is connected to the drain electrode of the second PMOS transistor M10, and the gate electrode of the first NMOS transistor M11 is connected to the data input terminal of the differential positive terminal of the second-stage differential inverter circuit; in the present embodiment, in the differential positive terminal of the second-stage differential inverter circuit, the first series node between the first PMOS transistor M9 and the second PMOS transistor M10 and a second series node located in the differential negative terminal of the second-stage differential inverter circuit and corresponding to the first series node are short-circuited; and the circuit structure of the differential negative terminal of the first-stage differential latch circuit is symmetrical to the circuit structure of the differential positive terminal of the first-stage differential latch circuit.

In an exemplary embodiment, a width-to-length ratio of a PMOS transistor terminal and a width-to-length ratio of an NMOS transistor terminal in the first-stage differential latch circuit are configured to be non-matching, and an intersection point of the output of the differential latch circuit is not located in the middle of the PMOS transistor terminal and the NMOS transistor terminal.

Since the two PMOS transistors in the pull-up terminal of the second-stage differential inverter circuit are connected in series, a channel length of an equivalent PMOS transistor can be increased, and a width-to-length ratio of the equivalent PMOS transistor can be reduced. The pull-down terminal adopts the structure formed by one PMOS transistor and one NMOS transistor, so that an intersection point of the output of the second-stage differential inverter circuit can be lowered, which can relieve the linearity problem caused by slow rising edges of the inverter output and solve the problems of reliability and inter-symbol interference. Thus, flexibility of the adjustment of the intersection points of the output data can be improved.

FIG. 7 is a schematic structural diagram of a switch driver according to an embodiment of the present disclosure. As shown in FIG. 7, the switch driver includes a plurality of switch driver units, and each switch driver unit includes: multiple data transmission links each including the differential latch circuit provided in the above embodiment.

In an exemplary embodiment, the multiple data transmission links include real-data transmission links for transmission of real data, and Dummy-data transmission links for transmission of Dummy data.

Figure 8:
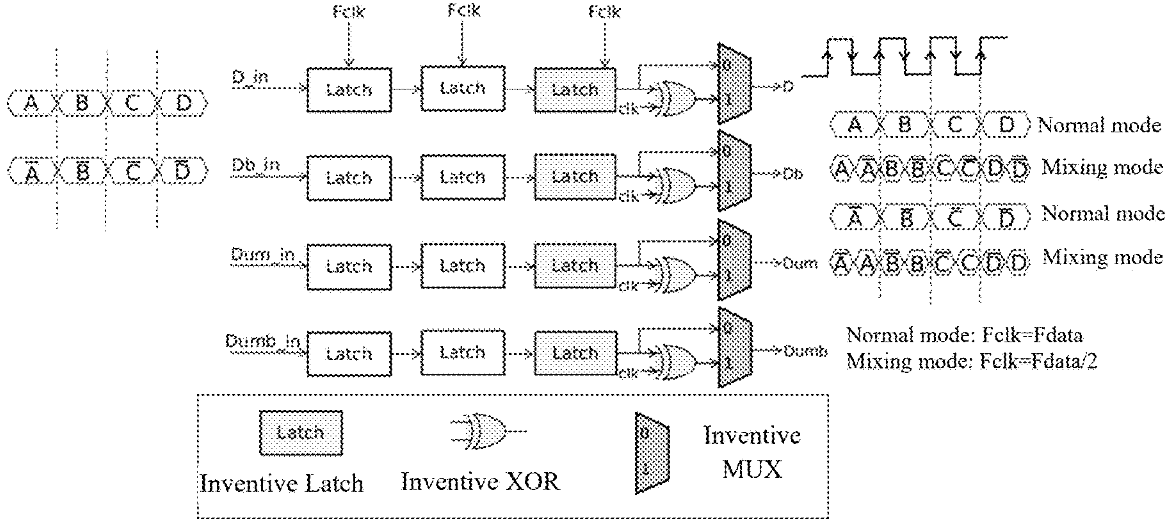
FIG. 8 is a schematic structural diagram of a switch driver according to another embodiment of the present disclosure.

FIG. 8 is a schematic structural diagram of a switch driver according to another embodiment of the present disclosure. As shown in FIG. 8, in addition to including all the structures shown in FIG. 7, the switch driver further includes: a plurality of exclusive OR logic units, a first input terminal of each exclusive OR logic unit being connected to an output terminal of the differential latch circuit in each data transmission link, and a second input terminal of each exclusive OR logic unit being connected to a clock input terminal; and a plurality of data selectors, a first input terminal of each data selector being connected to the output terminal of the differential latch circuit in each data transmission link, and a second input terminal of each data selector being respectively connected to output terminals of the exclusive OR logic units.

Figure 9:
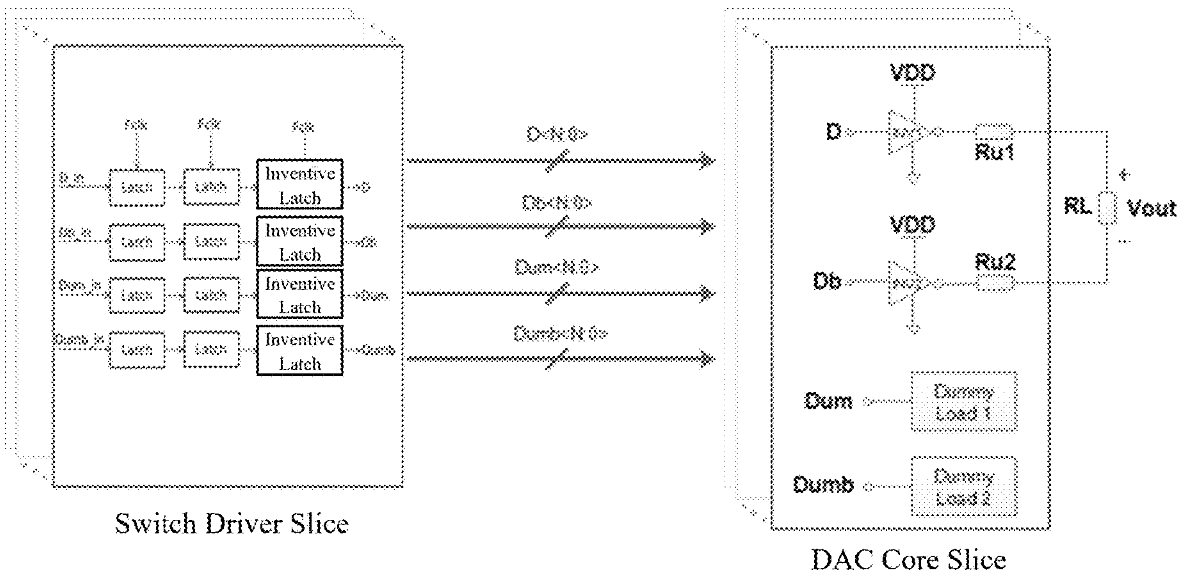
FIG. 9 is a schematic structural diagram of a multi-mode resistive digital-to-analog conversion circuit according to an embodiment of the present disclosure.

FIG. 9 is a schematic structural diagram of a multi-mode resistive digital-to-analog conversion circuit according to an embodiment of the present disclosure. As shown in FIG. 9, the multi-mode resistive digital-to-analog conversion circuit includes the switch driver shown in FIG. 7 and a digital-to-analog conversion core circuit connected to an output terminal of the switch driver.

In an exemplary embodiment, the digital-to-analog conversion core circuit includes a plurality of digital-to-analog converter core units, and each digital-to-analog converter core unit includes an inverter INV, an input terminal of the inverter being connected to output terminals of the real-data transmission links of the switch driver units; a unit resistor, a first terminal of the unit resistor being connected to an output terminal of the inverter, and a second terminal of the unit resistor being connected to a load resistor; and a first Dummy load, which is connected to output terminals of the Dummy-data transmission links of the switch driver units.

Figure 10:
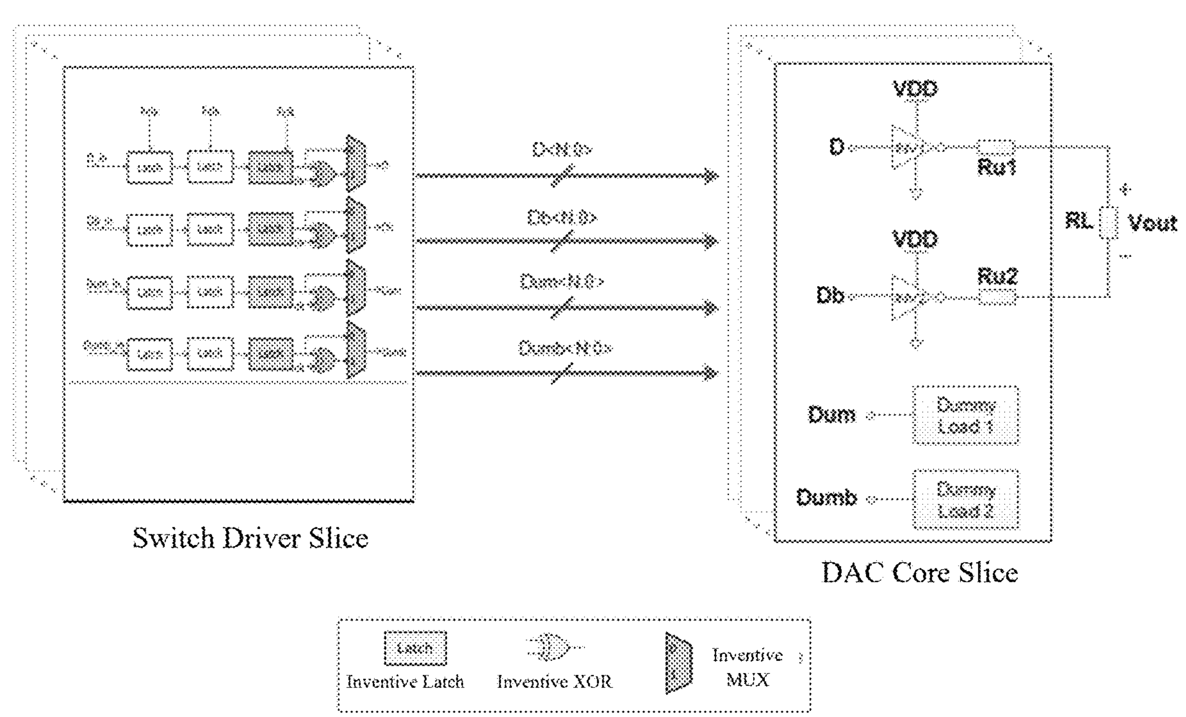
FIG. 10 is a schematic structural diagram of a multi-mode resistive digital-to-analog conversion circuit according to another embodiment of the present disclosure.

In an exemplary embodiment, as shown in FIG. 10, the switch driver in the multi-mode resistive digital-to-analog conversion circuit is the switch driver shown in FIG. 8.

Figure 11:
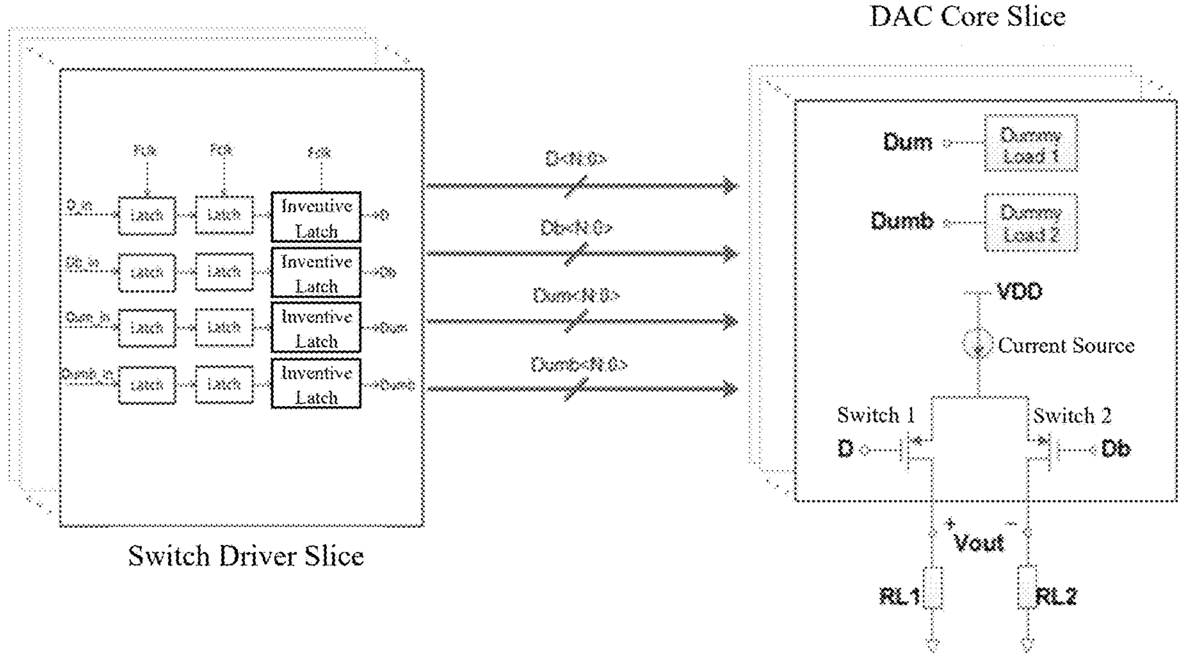
FIG. 11 is a schematic structural diagram of a multi-mode current-steering digital-to-analog conversion circuit according to an embodiment of the present disclosure.

FIG. 11 is a schematic structural diagram of a multi-mode current-steering digital-to-analog conversion circuit according to an embodiment of the present disclosure. As shown in FIG. 11, the multi-mode current-steering digital-to-analog conversion circuit includes the switch driver shown in FIG. 7 and a digital-to-analog conversion core circuit connected to an output terminal of the switch driver. The digital-to-analog conversion core circuit includes a plurality of digital-to-analog converter core units, and each digital-to-analog converter core unit includes: a sixth PMOS transistor, a gate electrode of the sixth PMOS transistor being connected to output terminals of the real-data transmission links of the switch driver units, a drain electrode of the sixth PMOS transistor being connected to a load resistor and an output terminal of the digital-to-analog conversion core circuit, and a source electrode of the sixth PMOS transistor being connected to an output terminal of a current source; and a second Dummy load, which is connected to output terminals of the Dummy-data transmission links of the switch driver units.

Figure 12:
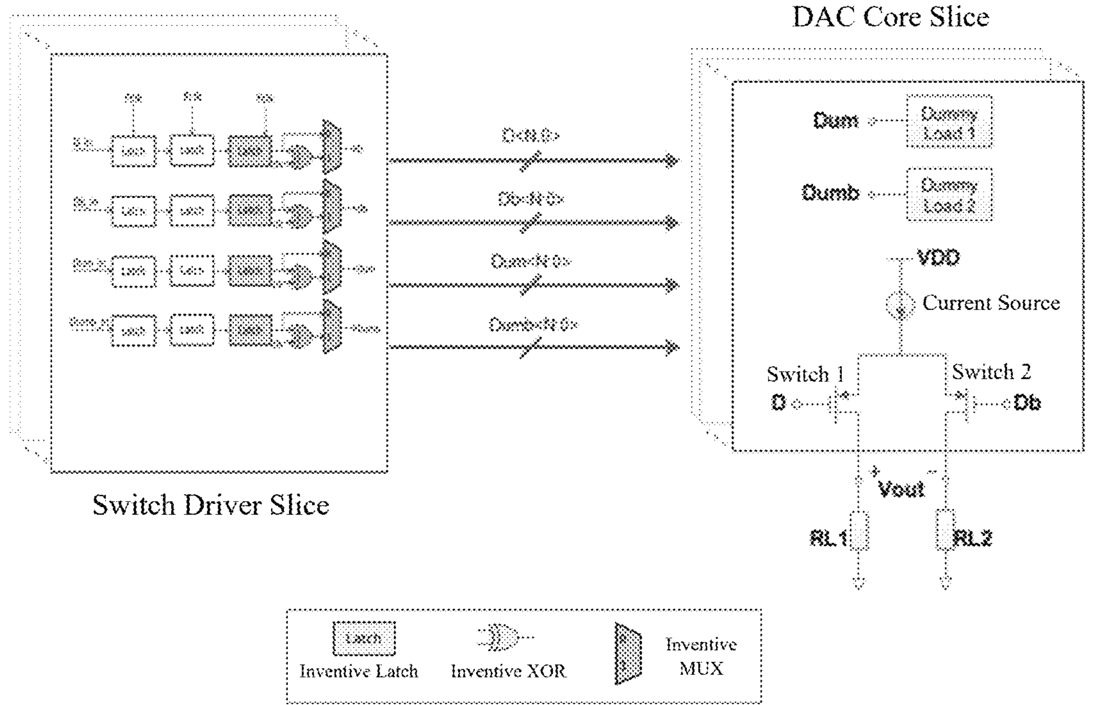
FIG. 12 is a schematic structural diagram of a multi-mode current-steering digital-to-analog conversion circuit according to another embodiment of the present disclosure.

In an exemplary embodiment, as shown in FIG. 12, the switch driver in the multi-mode current-steering digital-to-analog conversion circuit is the switch driver shown in FIG. 8.

In order to facilitate understanding of the technical solutions provided in the present disclosure, a detailed description is given below with reference to the embodiments of specific scenarios.

In order to overcome the problems of the existing technology that there is a limitation in the adjustment of the intersection points of the output data and overall circuit linearity is greatly reduced if a difficulty in the cooperation with the level shift circuit is not handled well, the embodiments of the present disclosure provide the latch circuit (in the present embodiment, the DFF circuit and the MUX circuit may be also designed similarly) with flexible adjustment of the intersection points of the output data and high compatibility of the level shift circuit, the high-linearity switch driver circuit adopting the latch circuit, and the high-linearity digital-to-analog conversion circuit adopting the switch driver circuit. Specifically, operations according to the embodiments of the present disclosure include:

a width-to-length ratio of a PMOS terminal and a width-to-length ratio of an NMOS terminal of the first-stage differential latch circuit of the latch circuit are intentionally designed to be non-matching, so as to make an intersection point of the latch output higher and an intersection point of the inverter output lower;

the two PMOS transistors of the pull-up terminal of the second-stage differential inverter circuit of the latch circuit are connected in series, so as to increase the channel length of the equivalent PMOS and reduce the width-to-length ratio of the equivalent PMOS, and the pull-down terminal adopts the CMOS structure, so as to lower the intersection point of the inverter output and relieve the linearity problem caused by the slow rising edges of the inverter output; and one extra PMOS transistor is added to the series node in the pull-up terminal of the second-stage differential inverter circuit of the latch circuit, so as to adjust the voltage of the series node and solve the problems of reliability and inter-symbol interference.

As shown in FIG. 5(*a*), the latch circuit structure in the embodiment of the present disclosure includes: the first-stage differential latch circuit I and the second-stage differential inverter circuit II.

In the first-stage differential latch circuit I, a circuit of the differential positive terminal is consistent with a circuit of the differential negative terminal. Taking the differential positive terminal as an example, a pull-up terminal of the first-stage differential latch circuit is formed by two PMOS transistors M1 and M2, gate electrodes of which are respectively connected to input data din and a input clock clkp, and a pull-down terminal of the first-stage differential latch circuit is formed by two NMOS transistors M3 and M4, gate electrodes of which are respectively connected to the input data din and an input clock clkn. The capability of the pull-up terminal and the capability of the pull-down terminal may be designed to match, that is, the width-to-length ratios of the PMOS terminal and the NMOS terminal are such designed that the pull-up current capability is similar to the pull-down current capability, so that the intersection point of the output of the first-stage differential latch circuit is at a middle position.

In the present embodiment, the width-to-length ratios of the PMOS terminal and the NMOS terminal may be intentionally designed to be non-matching, so as to prevent the intersection point of the output of the first-stage differential latch circuit from being at the middle position. For example, if the capability of the pull-up terminal is consistent with the capability of the pull-down terminal when the width-to-length ratio of the PMOS terminal is equal to the width-to-length ratio of the NMOS terminal, the width-to-length ratio of the PMOS terminal may be designed to be twice the width-to-length ratio of the NMOS terminal, so as to make the intersection point of the output of the first-stage differential latch circuit higher.

In the second-stage differential inverter circuit II, a circuit of the differential positive terminal is consistent with a circuit of the differential negative terminal. Taking the differential positive terminal as an example, the pull-up terminal of the second-stage differential inverter circuit is a structure formed by the two series-connected PMOS transistors M9 and M10, that is, the gate electrodes of the two PMOS transistors are short-circuited, one of the two PMOS transistors has the source electrode connected to the power supply voltage and the drain electrode connected to the source electrode of the other PMOS transistor, and the drain electrode of the other PMOS transistor is pulled out to be connected to the pull-down terminal of the second-stage differential inverter circuit. One extra PMOS transistor M17 is added to the series node between the two PMOS transistors, the PMOS transistor has the source electrode connected to the power supply voltage, the drain electrode connected to the series node, and the gate electrode connected to the input of the other differential terminal of the second-stage differential inverter circuit, and the extra PMOS transistor can control the voltage of the series node well; and the pull-down terminal of the second-stage differential inverter circuit adopts the CMOS structure, and includes the PMOS transistor M15 and the NMOS transistor M11, the drain electrode of the PMOS transistor and the source electrode of the NMOS transistor are connected to each other and further connected to the output of the level shift circuit, so that a low level output by the second-stage differential inverter circuit is not a ground but a value to meet design requirements.

In an exemplary embodiment, the differential latch circuit at least includes the following variations:

1. There may be a plurality of variations of the solution of adjusting a differential output intersection point through a PMOS series connection at the pull-up terminal of the second-stage differential inverter circuit, the number of series-connected PMOS transistors may be more than one, and according to different design requirements, an NMOS series connection, a CMOS series connection, or combinations of various series connections may replace the PMOS series connection to be applied to the pull-up terminal or the pull-down terminal. In addition, the PMOS series connection may be applied to the inverter in the rear stage or to the Latch in the front stage, or to both the two stages, or to neither of the two stages.
2. There may be a plurality of variations of the mode of controlling a potential of the PMOS series node, as shown in FIG. 5(*b*), FIG. 5(*c*), and FIG. 6. As shown in FIG. 6, the series node between M9 and M10 and the series node between M12 and M13 are directly short-circuited in the second-stage differential inverter circuit; as shown in FIG. 5(*b*), the source electrodes of the two extra PMOS transistors added to the PMOS series node are not connected to the power supply but are directly short-circuited; and as shown in FIG. 5(*c*), the gate electrodes of the two extra PMOS transistors added to the PMOS series node are changed to be controlled by dout and doubt. In addition to the proposed variations, there are more modes that can be easily envisaged according to the mode described in the present disclosure, and all the modes aim to avoid an adverse effect caused by the PMOS series node being in a high resistance state. Apparently, these modes of controlling the potential of the series node may be adopted for a plurality of PMOS series connection, the NMOS series connection, and the combinations of various series connections to be applied to the pull-up terminal or the pull-down terminal, or may be applied to part of the series nodes according to actual design situations. In addition, besides being applied to the inverter in the rear stage, these modes of controlling the potential of the series node may be also applied to the latch in the front stage, or to both the two stages, or to neither of the two stages.
3. The adoption of the CMOS structure in the pull-down terminal of the second-stage differential inverter circuit ensures that there may be a plurality of variations of the pull-down capability of the pull-down terminal in case of different process corners, and combinations of a plurality of CMOS series connections or parallel connections may replace the CMOS structure to be applied to the pull-up terminal or the pull-down terminal. In addition, the CMOS structure may be applied to the inverter in the rear stage or to the latch in the front stage, or to both the two stages, or to neither of the two stages.

4. The level shift circuit may be added to the pull-up terminal or the pull-down terminal of the second-stage differential inverter circuit according to design requirements, and an output voltage of the level shift circuit may be higher or lower than a ground voltage, or may be higher or lower than the power supply voltage. In addition, the level shift circuit may be applied to the inverter in the rear stage or to the latch in the front stage, or to both the two stages, or to neither of the two stages.
5. The above variations 1-4 may be applied to the aforesaid variations of the conventional latch, may be similarly applied to the design of the circuits of the DFF and the MUX which have the synchronization function and the variations thereof, may be applied to the design of the other sequential logic circuits, and may be applied to the design of the combinational logic circuits.
6. The above variations 1-4 may be applied to the switch drivers adopting the circuits of the latch, the DFF, the MUX, the other sequential logic, and the combinational logic and the variations thereof, may be applied to the aforesaid various variations of the conventional switch driver, and may be applied to high-speed DACs adopting the switch drivers and the variations thereof.
7. The above variations 1-4 may be further applied to all analog circuits and all mixed-signal circuits that need to adopt all or part of the techniques.

In an exemplary embodiment, FIG. 5(*a*) illustrates an assumption that the intersection point of the differential output of the second-stage differential inverter circuit is low according to the design requirements, and such low intersection point is realized in the following modes according to the present disclosure:

the width-to-length ratio of the PMOS terminal and the width-to-length ratio of the NMOS terminal of the first-stage differential latch circuit are intentionally designed to be non-matching, so that the intersection point of the latch output is higher and the intersection point of the inverter output is accordingly lower;

the two PMOS transistors M9 and M10 of the pull-up terminal of the second-stage differential inverter circuit are connected in series, so that the channel length of the equivalent PMOS transistor is increased, the width-to-length ratio of the equivalent PMOS transistor is reduced, and the intersection point of the inverter output can be easily lowered; and the pull-down terminal of the second-stage differential inverter circuit adopts the CMOS structure and includes the PMOS transistor M15 and the NMOS transistor M11, and the CMOS structure can well ensure the pull-down capability of the second-stage differential inverter circuit in case of different process corners, especially in extreme process conditions of SNFP and FNSP, so that the intersection point of the inverter output can be easily lowered.

FIG. 5(*a*) illustrates an assumption that the second-stage differential inverter circuit is desired to output a low level instead of a ground potential according to the design requirements, so that the output of a level shift circuit is added to the pull-down terminal. If the output of the level shift circuit is higher than the ground potential, the current capability of the pull-down terminal of the second-stage differential inverter circuit is reduced, which is not favorable for the lowering of the intersection point of the inverter output, and the above three modes are needed to compensate for this unfavorable effect. Conversely, if the output of the level shift circuit is lower than the ground potential, the intersection point of the inverter output can be easily lowered.

The differential Latch circuit provided in the above embodiments of the present disclosure may be used to implement the switch driver circuit provided in the embodiments of the present disclosure. As shown in FIG. 7, the first switch driver structure provided in the embodiments of the present disclosure adopts the general data format, and performs data sampling at the rising edges of the clock. The upper two paths perform transmission of the real signals, and the lower two paths perform transmission of the Dummy data. At each data sampling point, if the real data is not flipped, the Dummy data is flipped; and if the real data is flipped, the Dummy data is not flipped. The latches in the third stage adopt the latch shown in any one of FIG. 5(*a*), FIG. 5(*b*), FIG. 5(*c*), and FIG. 6 of the present disclosure.

As shown in FIG. 7, in the present embodiment, the real data Din and Db_in of the upper two paths pass through the latches in the previous two stages to be sequentially beaten by Folk, are sent to the Latches of the present disclosure, and are finally output to the next stage. The Dummy data Dum_in and Dumb_in of the lower two paths are output to the next stage through the same path.

FIG. 8 is a schematic diagram of the second switch driver structure according to the embodiments of the present disclosure, which is characterized by the compatibility between the normal mode and the mixing mode. In the mixing mode, the data changes occur on both the rising edges and the falling edges of the clock, and the data corresponding to the falling edges is the inversion of the data corresponding to the rising edges, which is equivalent to the mixing effect of the real signal and the clock signal, and the bandpass transfer function taking Folk as a center is finally realized in the output of the DAC (the low-pass transfer function is realized in the normal mode), which is favorable for the high-intermediate-frequency and low-bandwidth applications. Merely one of Latch, XOR, or MUX shown in FIG. 8 adopts the technology provided in the embodiments of the present disclosure, or a combination of Latch, XOR, or MUX shown in FIG. 8 adopts the technology provided in the embodiments of the present disclosure.

In an exemplary embodiment, the first and second switch drivers described above at least include the following variations.

The technology related to the Latch provided in the embodiments of the present disclosure may be applied to the aforesaid variations of the conventional latch, may be similarly applied to the design of the circuits of the DFF and the MUX which have the synchronization function and the variations thereof, may be applied to the design of the other sequential logic circuits, and may be applied to the design of the combinational logic circuits. Therefore, any switch driver to which the technology related to the latch of the present disclosure is applied falls within the scope of the embodiments of the present disclosure, includes the various variations of the conventional switch driver described above, and also includes various variations of the conventional switch driver that are not described above.

The differential latch circuit in the above embodiments of the present disclosure may be also used to implement two types of low-power consumption and high-linearity multi-mode digital-to-analog conversion circuits. The two types of digital-to-analog conversion circuits differ in the structure of the DAC core units, and are respectively the multi-mode current-steering digital-to-analog conversion circuit of the present disclosure and the multi-mode resistive digital-to-analog conversion circuit of the present disclosure. The two types of digital-to-analog conversion circuits will be described in detail below in specific implementations.

FIG. 9 is a schematic diagram of the first multi-mode resistive digital-to-analog conversion circuit structure according to the embodiments of the present disclosure. FIG. 9 merely includes the first switch driver of the present disclosure and the DAC core circuit (DAC Core), and does not include other parts. The switch driver of the present disclosure includes the differential latch circuit (Latch) of the present disclosure. According to the number of DAC bits and a DAC segmentation situation, the switch driver needs to be divided into a plurality of units (Slice) for multi-bit data output (FIG. 9 illustrates a case of N-bit data output), and the switch driver units adopt the switch driver structure disclosed by the present disclosure, so as to realize high speed and high linearity. Similarly, the DAC core circuit is divided into a plurality of units (Slice) for data reception.

As shown in FIG. 9, the real data D<N:0> and Db<N:0> output by the switch driver are respectively connected to the input of the inverter circuit INV1 and the input of the inverter circuit INV2 in the DAC core circuit for selecting a power supply potential or the ground potential to left ports of the unit resistor Ru1 and the unit resistor Ru2, right ports of the unit resistors Ru1 in all the DAC core circuit units may be connected together and further connected to the load resistor as a differential output positive terminal, and right ports of all the unit resistors Ru2 are connected together as a differential output negative terminal, so as to form a resistor network together. According to a difference between the data D<N:0> and the data Db<N:0>, the number of the unit resistors Ru1 connected to the power supply potential/the ground potential in the resistance network is different from the number of the unit resistors Ru2 connected to the power supply potential/the ground potential in the resistance network, and a linear conversion relationship of an output differential voltage Vout and the input data is realized. The Dummy data Dum<N:0> and Dumb<N:0> output by the switch driver enter the DAC core circuit unit and are then connected to the Dummy loads which are approximately the same as the loads of the real data D<N:0> and Db<N:0>.

FIG. 10 is a schematic diagram of the second multi-mode resistive digital-to-analog conversion circuit structure according to the embodiments of the present disclosure. FIG. 10 merely includes the second switch driver of the present disclosure and the DAC core circuit (DAC Core), and does not include other parts. Except for the switch driver, the remaining parts shown in FIG. 10 are the same as those shown in FIG. 9.

In an exemplary embodiment, the first and second multi-mode resistive digital-to-analog conversion circuit structures of the present disclosure at least include the following variations.

1. The switch driver of the digital-to-analog conversion circuit may be any variation of the switch driver described above.
2. The DAC core circuits shown in FIG. 9 and FIG. 10 are a basic resistive digital-to-analog conversion circuit structure. The present disclosure may be applied to other variant structures of the resistive digital-to-analog conversion circuit. In addition, the power supply potential and the ground potential may be replaced with a positive reference potential and a negative reference potential, and the unit resistor Ru1 and the unit resistor Ru2 may be configured with different resistance values in different DAC core circuit units for realizing different weights.
3. In order to ensure that the loads of the Dummy data are approximately the same as the loads of the real data at the input terminal of the DAC core circuit, the Dummy loads are added to the DAC core circuit. The Dummy loads may be simplified or deleted according to actual needs.

FIG. 11 is a schematic diagram of the first multi-mode current-steering digital-to-analog conversion circuit structure according to the embodiments of the present disclosure. FIG. 11 merely includes the first switch driver of the present disclosure and the DAC core circuit (DAC Core), and does not include other parts. The switch driver of the present disclosure includes the differential latch circuit (Latch) of the present disclosure. According to the number of DAC bits and a DAC segmentation situation, the switch driver needs to be divided into a plurality of units (Slice) for multi-bit data output (FIG. 11 illustrates a case of N-bit data output), and the switch driver units adopt the switch driver structure disclosed by the present disclosure, so as to realize high speed and high linearity. Similarly, the DAC core circuit is divided into a plurality of units (Slice) for data reception.

As shown in FIG. 11, the real data D<N:0> and Db<N:0> output by the switch driver are respectively connected to a gate electrode of the switch circuit Switch1 and a gate electrode of the switch circuit Switch2 in the DAC core circuit for selecting an output current of the current source to an upper port (i.e. a differential output positive terminal or a differential output negative terminal of the digital-to-analog conversion circuit) of the load resistor RL1 or RL2. Drain electrodes of the switch circuits Switch1 of all the DAC core circuit units are connected together, and drain electrodes of all the switch circuits Switch2 are connected together. For the whole DAC core circuit, according to a difference between the data D<N:0> and the data Db<N:0>, a total current flowing to the load resistor RL1 is different from a total current flowing to the load resistor RL2, a differential output voltage Vout corresponding to the load resistor RL1 is also different from a differential output voltage Vout corresponding to the load resistor RL2, and a linear conversion relationship of an output differential voltage Vout and the input data is finally realized. The Dummy data Dum<N:0> and Dumb<N:0> output by the switch driver enter the DAC core circuit unit and are then connected to the Dummy loads which are approximately the same as the loads of the real data D<N:0> and Db<N:0>.

FIG. 12 is a schematic diagram of the second multi-mode current-steering digital-to-analog conversion circuit structure according to the embodiments of the present disclosure. FIG. 12 merely includes the second switch driver of the present disclosure and the DAC core circuit (DAC Core), and does not include other parts. Except for the switch driver, the remaining parts shown in FIG. 12 are the same as those shown in FIG. 11.

In an exemplary embodiment, the first and second multi-mode current-steering digital-to-analog conversion circuit structures of the present disclosure at least include the following variations.

1. The switch driver of the digital-to-analog conversion circuit may be any variation of the switch driver described above.
2. The DAC core circuits shown in FIG. 11 and FIG. 12 are a basic current-steering digital-to-analog conversion circuit structure. The present disclosure may be applied to other variant structures of the current-steering digital-to-analog conversion circuit.
3. In order to ensure that the loads of the Dummy data are approximately the same as the loads of the real data at the input terminal of the DAC core circuit, the Dummy loads are added to the DAC core circuit. The Dummy loads may be simplified or deleted according to actual needs.

According to the above embodiments of the present disclosure, the series connection of the two PMOS transistors M9 and M10 of the pull-up terminal of the second-stage differential inverter circuit can effectively increase the channel length of the equivalent PMOS transistor, reduce the width-to-length ratio of the equivalent PMOS transistor, and realize the control of the intersection points of the inverter output together with the pull-down terminal. Compared with a method of directly adopting one PMOS transistor and reducing a channel width of the one PMOS transistor, the series connection of the two PMOS transistors can increase an effective area of the equivalent PMOS transistor, relieve the mismatch problem of the pull-up terminal caused by the small-size MOS transistor, and also relieve the linearity problem caused by the mismatch problem; and compared with a method of directly adopting one PMOS transistor and increasing a channel length of the one PMOS transistor, in many small-size processes, the performance of a short-channel-length device is often more optimized, and the linearity problem caused by the slow rising edges of the inverter output can be relieved.

According to the embodiments of the present disclosure, the extra PMOS transistor M17 added to the series node between the two PMOS transistors M9 and M10 can well control the voltage of the series node. If the series node between the two PMOS transistors is not processed in any mode, the series node is in a high-impedance state when the input terminal of the second-stage differential inverter circuit is at a high level, in which case the voltage of the series node can be easily interfered and a lot of problems are thus caused in the design for a high speed. For example, when the voltage of the input terminal of the second-stage differential inverter circuit is rapidly changed from a low level to a high level, the voltage of the series node may rise rapidly along with the increase of the level and may rise even higher than the power supply voltage, which may cause a reliability problem of the design, and at this time, the voltage of the series node is in the high-impedance state, and takes a long time to recover from the state of being higher than the power supply voltage to a normal state (close to the power supply voltage). For the recovering process, there are two cases: the first case is that the voltage of the input terminal of the second-stage differential inverter circuit is rapidly switched from the high level to the low level again, the series node between the two PMOS transistors first discharges in the state of being higher than the power supply voltage, the voltage of the series node between the two PMOS transistors decreases, an output node of the second-stage differential inverter circuit is pulled up, and finally the voltage of the series node between the two PMOS transistors and the output of the second-stage differential inverter circuit are both close to the power supply voltage; and the second case is that the voltage of the input terminal of the second-stage differential inverter circuit is maintained at the high level for a long time, such that the series node between the two PMOS transistors is recovered to the normal state (close to the power supply voltage), at this time, the series node between the two PMOS transistors discharges in the state of being close to the power supply voltage, and the output node of the second-stage differential inverter circuit is pulled up. For these two cases, a pull-up time of the output of the second-stage differential inverter circuit is different, which causes the problem of inter-symbol interference in the design for a high-speed circuit.

The above problems can be solved by adding one extra PMOS transistor to the series node between the two PMOS transistors. When the voltage of the input terminal of the second-stage differential inverter circuit at one differential terminal is rapidly changed from the low level to the high level, the voltage of the series node may rise rapidly along with the increase of the level and may be even in a state of being higher than the power supply voltage in a short time. Since the gate electrode of the additional PMOS transistor is connected to the input (from a high level to a low level) of the second-stage differential inverter circuit at the other differential terminal, the PMOS transistor is turned on to pull the voltage of the series node back to the power supply voltage rapidly, thereby overcome the reliability problems and the inter-symbol interference problem described above. When the voltage of the input terminal of the second-stage differential inverter circuit at the one differential terminal is rapidly changed from the high level to the low level, the additional PMOS transistor is turned off, and does not affect the characteristics of the pull-up terminal of the second-stage differential inverter circuit and the control of the intersection points.

Apparently, it should be understood by those of ordinary skill in the art that all the modules or steps of the present disclosure described above may be implemented by a general-purpose computing device, may be integrated in a single computing device or distributed on a network composed of a plurality of computing devices. The modules or steps may be implemented by program codes executable by a computing device, such that the modules or steps can be stored in a storage device and executed by a computing device. In some cases, the steps illustrated or described may be performed in an order different from that described herein. The modules or steps may be separately made into integrated circuit modules, or some of the modules or steps may be made into a single integrated circuit module. Thus, the present disclosure is not limited to any specific combination of hardware and software.

The description above is merely of the preferable embodiments of the present disclosure, but is not intended to limit the present disclosure. Various modifications and changes may be made to the present disclosure by those of ordinary skill in the art. Any modification, equivalent replacement and improvement made within the principle of the present disclosure should be included in the protection scope of the present disclosure.

What is claimed is:

1. A differential latch circuit, comprising a first-stage differential latch circuit, a second-stage differential inverter circuit, and a low-level shift circuit connected in sequence, wherein a pull-up terminal of a differential positive terminal of the second-stage differential inverter circuit comprises a first P-Channel Metal-Oxide-Semiconductor (PMOS) transistor and a second PMOS transistor, and a gate electrode of the first PMOS transistor is connected to a gate electrode of the second PMOS transistor; a source electrode of the first PMOS transistor is connected to a power supply voltage; a drain electrode of the first PMOS transistor is connected to a source electrode of the second PMOS transistor; and the gate electrode of the first PMOS transistor and the gate electrode of the second PMOS transistor are connected to a data input terminal of the differential positive terminal of the second-stage differential inverter circuit; and a pull-down terminal of the differential positive terminal of the second-stage differential inverter circuit comprises a third PMOS transistor and a first N-Channel Metal-Oxide-Semiconductor (NMOS) transistor, and a drain electrode of the third PMOS transistor and a source electrode of the first NMOS transistor are connected to each other, and are connected both to an output terminal of a level shift circuit; a gate electrode of the third PMOS transistor is connected to the data input terminal of the differential positive terminal of the second-stage differential inverter circuit, and a source electrode of the third PMOS transistor is connected to an output terminal of a pull-down terminal of a differential negative terminal of the second-stage differential inverter circuit; a drain electrode of the first NMOS transistor is connected to a drain electrode of the second PMOS transistor, and a gate electrode of the first NMOS transistor is connected to the data input terminal of the differential positive terminal of the second-stage differential inverter circuit; and a circuit structure of a differential negative terminal of the first-stage differential latch circuit is symmetrical to a circuit structure of a differential positive terminal of the first-stage differential latch circuit.

2. The circuit of claim 1, wherein the differential positive terminal of the second-stage differential inverter circuit further comprises: a fourth PMOS transistor, wherein a source electrode of the fourth PMOS transistor is connected to the power supply voltage, a gate electrode of the fourth PMOS transistor is connected to a data input terminal of the differential negative terminal of the second-stage differential inverter circuit, and a drain electrode of the fourth PMOS transistor is connected to a first series node between the first PMOS transistor and the second PMOS transistor; or the source electrode of the fourth PMOS transistor is connected to a source electrode of a fifth PMOS transistor located at the differential negative terminal of the second-stage differential inverter circuit and corresponding to the fourth PMOS transistor; and the gate electrode of the fourth PMOS transistor is connected to the data input terminal of the differential negative terminal of the second-stage differential inverter circuit, and the drain electrode of the fourth PMOS transistor is connected to the first series node between the first PMOS transistor and the second PMOS transistor; or the source electrode of the fourth PMOS transistor is connected to the power supply voltage, the gate electrode of the fourth PMOS transistor is connected to a data output terminal of the differential positive terminal of the second-stage differential inverter circuit, and the drain electrode of the fourth PMOS transistor is connected to the first series node between the first PMOS transistor and the second PMOS transistor.

3. The circuit of claim 1, wherein a first series node between the first PMOS transistor and the second PMOS transistor and a second series node located in the differential negative terminal of the second-stage differential inverter circuit and corresponding to the first series node are short-circuited, wherein the first series node is located between the drain electrode of the first PMOS transistor and the source electrode of the second PMOS transistor.

4. The circuit of claim 1, wherein a width-to-length ratio of a PMOS transistor terminal and a width-to-length ratio of an NMOS transistor terminal in the first-stage differential latch circuit are configured to be non-matching, and an intersection point of output of the differential latch circuit is not located in the middle of the PMOS transistor terminal and the NMOS transistor terminal.

5. A switch driver, comprising a plurality of switch driver units, wherein each of the switch driver units comprises multiple data transmission links, and each data transmission link comprises the differential latch circuit of claim 1.

6. The switch driver of claim 5, wherein the multiple data transmission links comprise real-data transmission links for transmission of real data, and Dummy-data transmission links for transmission of Dummy data.

7. The switch driver of claim 5, further comprising:

a plurality of exclusive OR logic units, a first input terminal of each exclusive OR logic unit being connected to an output terminal of the differential latch circuit in each data transmission link, and a second input terminal of each exclusive OR logic unit being connected to a clock input terminal; and a plurality of data selectors, a first input terminal of each data selector being connected to the output terminal of the differential latch circuit in each data transmission link, and a second input terminal of each data selector being respectively connected to output terminals of the exclusive OR logic units.

8. A digital-to-analog conversion circuit, comprising the switch driver of claim 5, and a digital-to-analog conversion core circuit connected to an output terminal of the switch driver.

9. The digital-to-analog conversion circuit of claim 8, wherein the digital-to-analog conversion core circuit comprises a plurality of digital-to-analog converter core units, and each of the digital-to-analog converter core units comprises:

an inverter, an input terminal of the inverter being connected to output terminals of real-data transmission links of the switch driver units; and a first Dummy load, which is connected to output terminals of Dummy-data transmission links of the switch driver units.

10. The digital-to-analog conversion circuit of claim 8, wherein the digital-to-analog conversion core circuit comprises a plurality of digital-to-analog converter core units, and each of the digital-to-analog converter core units comprises:

a sixth PMOS transistor, a gate electrode of the sixth PMOS transistor being connected to output terminals of real-data transmission links of the switch driver units, a drain electrode of the sixth PMOS transistor being connected to a load resistor and an output terminal of the digital-to-analog conversion core circuit, and a source electrode of the sixth PMOS transistor being connected to a power supply voltage; and a second Dummy load, which is connected to output terminals of Dummy-data transmission links of the switch driver units.

11. The switch driver of claim 5, wherein the differential positive terminal of the second-stage differential inverter circuit further comprises: a fourth PMOS transistor, wherein a source electrode of the fourth PMOS transistor is connected to the power supply voltage, a gate electrode of the fourth PMOS transistor is connected to a data input terminal of the differential negative terminal of the second-stage differential inverter circuit, and a drain electrode of the fourth PMOS transistor is connected to a first series node between the first PMOS transistor and the second PMOS transistor; or the source electrode of the fourth PMOS transistor is connected to a source electrode of a fifth PMOS transistor located at the differential negative terminal of the second-stage differential inverter circuit and corresponding to the fourth PMOS transistor; and the gate electrode of the fourth PMOS transistor is connected to the data input terminal of the differential negative terminal of the second-stage differential inverter circuit, and the drain electrode of the fourth PMOS transistor is connected to the first series node between the first PMOS transistor and the second PMOS transistor; or the source electrode of the fourth PMOS transistor is connected to the power supply voltage, the gate electrode of the fourth PMOS transistor is connected to a data output terminal of the differential positive terminal of the second-stage differential inverter circuit, and the drain electrode of the fourth PMOS transistor is connected to the first series node between the first PMOS transistor and the second PMOS transistor.

12. The switch driver of claim 11, wherein a first series node between the first PMOS transistor and the second PMOS transistor and a second series node located in the differential negative terminal of the second-stage differential inverter circuit and corresponding to the first series node are short-circuited, wherein the first series node is located between the drain electrode of the first PMOS transistor and the source electrode of the second PMOS transistor.

13. The switch driver of claim 11, further comprising:

a plurality of exclusive OR logic units, a first input terminal of each exclusive OR logic unit being connected to an output terminal of the differential latch circuit in each data transmission link, and a second input terminal of each exclusive OR logic unit being connected to a clock input terminal; and a plurality of data selectors, a first input terminal of each data selector being connected to the output terminal of the differential latch circuit in each data transmission link, and a second input terminal of each data selector being respectively connected to output terminals of the exclusive OR logic units.

14. The switch driver of claim 12, further comprising:

a plurality of exclusive OR logic units, a first input terminal of each exclusive OR logic unit being connected to an output terminal of the differential latch circuit in each data transmission link, and a second input terminal of each exclusive OR logic unit being connected to a clock input terminal; and a plurality of data selectors, a first input terminal of each data selector being connected to the output terminal of the differential latch circuit in each data transmission link, and a second input terminal of each data selector being respectively connected to output terminals of the exclusive OR logic units.

15. The digital-to-analog conversion circuit of claim 8, wherein the multiple data transmission links comprise real-data transmission links for transmission of real data, and Dummy-data transmission links for transmission of Dummy data.

16. The digital-to-analog conversion circuit of claim 8, further comprising:

a plurality of exclusive OR logic units, a first input terminal of each exclusive OR logic unit being connected to an output terminal of the differential latch circuit in each data transmission link, and a second input terminal of each exclusive OR logic unit being connected to a clock input terminal; and a plurality of data selectors, a first input terminal of each data selector being connected to the output terminal of the differential latch circuit in each data transmission link, and a second input terminal of each data selector being respectively connected to output terminals of the exclusive OR logic units.

17. The digital-to-analog conversion circuit of claim 15, wherein the digital-to-analog conversion core circuit comprises a plurality of digital-to-analog converter core units, and each of the digital-to-analog converter core units comprises:

an inverter, an input terminal of the inverter being connected to output terminals of real-data transmission links of the switch driver units; and a first Dummy load, which is connected to output terminals of Dummy-data transmission links of the switch driver units.

18. The digital-to-analog conversion circuit of claim 15, wherein the digital-to-analog conversion core circuit comprises a plurality of digital-to-analog converter core units, and each of the digital-to-analog converter core units comprises:

a sixth PMOS transistor, a gate electrode of the sixth PMOS transistor being connected to output terminals of real-data transmission links of the switch driver units, a drain electrode of the sixth PMOS transistor being connected to a load resistor and an output terminal of the digital-to-analog conversion core circuit, and a source electrode of the sixth PMOS transistor being connected to a power supply voltage; and a second Dummy load, which is connected to output terminals of Dummy-data transmission links of the switch driver units.

19. The digital-to-analog conversion circuit of claim 16, wherein the digital-to-analog conversion core circuit comprises a plurality of digital-to-analog converter core units, and each of the digital-to-analog converter core units comprises:

an inverter, an input terminal of the inverter being connected to output terminals of real-data transmission links of the switch driver units; and a first Dummy load, which is connected to output terminals of Dummy-data transmission links of the switch driver units.

20. The digital-to-analog conversion circuit of claim 16, wherein the digital-to-analog conversion core circuit comprises a plurality of digital-to-analog converter core units, and each of the digital-to-analog converter core units comprises:

a sixth PMOS transistor, a gate electrode of the sixth PMOS transistor being connected to output terminals of real-data transmission links of the switch driver units, a drain electrode of the sixth PMOS transistor being connected to a load resistor and an output terminal of the digital-to-analog conversion core circuit, and a source electrode of the sixth PMOS transistor being connected to a power supply voltage; and a second Dummy load, which is connected to output terminals of Dummy-data transmission links of the switch driver units.

* * * * *